United States Patent [19]

Takubo et al.

[11] Patent Number: 5,615,822
[45] Date of Patent: Apr. 1, 1997

[54] METHOD AND APPARATUS FOR CONTROLLING BONDING LOAD OF FINE LEAD ELECTRODE

[75] Inventors: Chiaki Takubo, Yokohama; Hiroshi Tazawa, Ichikawa; Eiichi Hosomi; Koji Shibasaki, both of Kawasaki, all of Japan

[73] Assignee: Kabushiki Kaisha Toshiba, Kawasaki, Japan

[21] Appl. No.: 532,281

[22] Filed: Sep. 22, 1995

[30] Foreign Application Priority Data

Sep. 27, 1994 [JP] Japan .................................. 6-231718

[51] Int. Cl.⁶ ............................................. H01L 21/603
[52] U.S. Cl. .......................... 228/102; 228/9; 228/180.22; 228/105
[58] Field of Search .......................... 228/102, 9, 180.22, 228/180.21, 105

[56] References Cited

U.S. PATENT DOCUMENTS 5,240,165  8/1993  Geyer et al. ............................ 228/102
5,314,105  5/1994  Farassat ................................. 228/102

Primary Examiner—Kenneth J. Ramsey
Attorney, Agent, or Firm—Finnegan, Henderson, Farabow, Garrett & Dunner, L.L.P.

[57] ABSTRACT

In this invention, a designed value of a lead width is previously input and a bonding load suitable for the designed lead width is previously input before the step of continuously bonding a TAB tape on a semiconductor chip is effected. Next, the TAB tape and chip are carried to preset positions, and after recognition of the positions of the tape and chip and the alignment of the tape and chip by use of a CCD camera are completed, the inner lead width is actually measured by use of the CCD camera. The measured lead width is compared with the designed lead width, and when a difference therebetween exceeds a preset reference value, the bonding load is changed to a bonding load suitable for the measured lead width of the lead to be actually bonded based on the ratio of the measured lead width to the designed lead width and then the bonding operation is effected by the suitable bonding load.

19 Claims, 13 Drawing Sheets

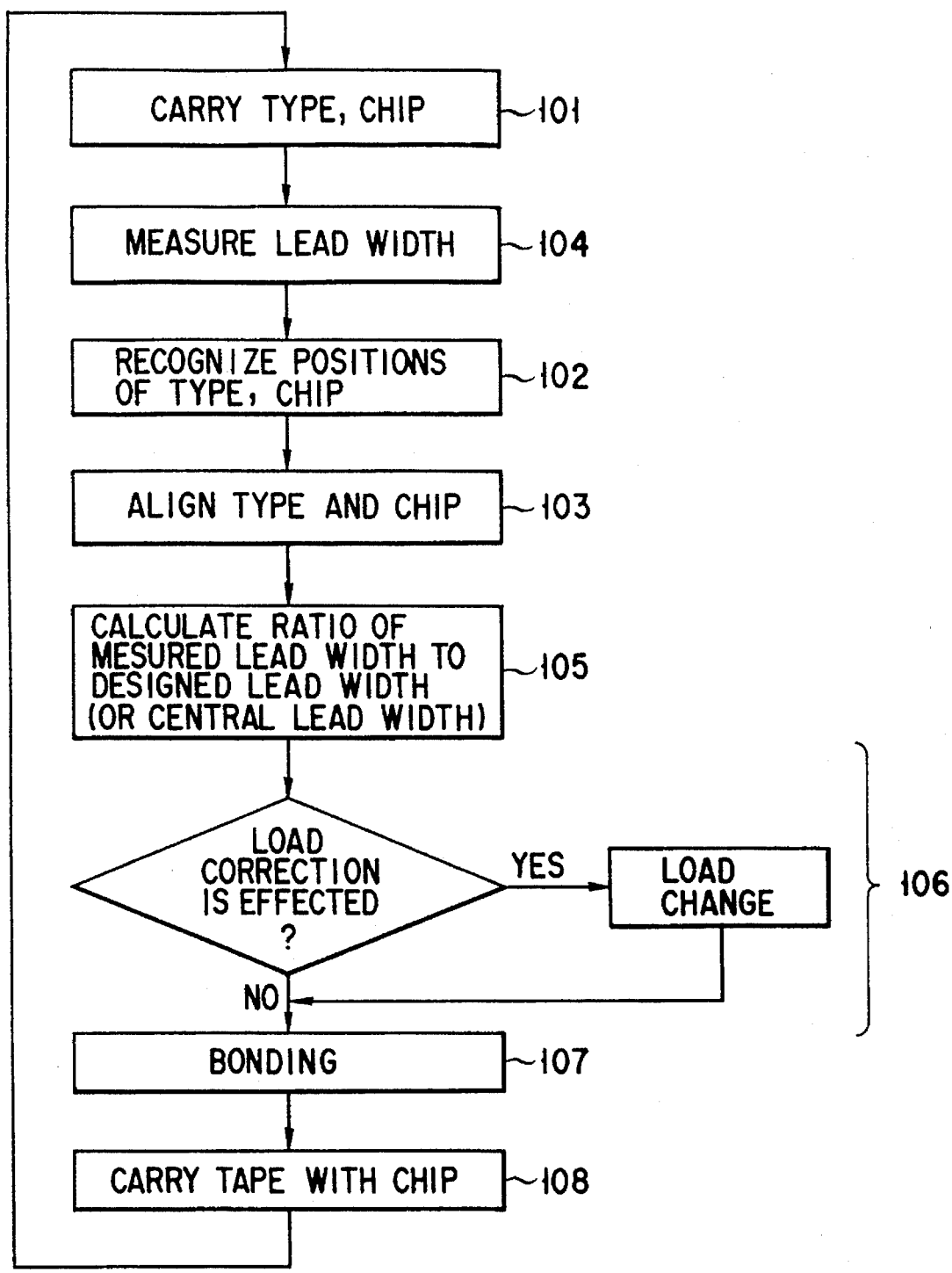
F I G. 6

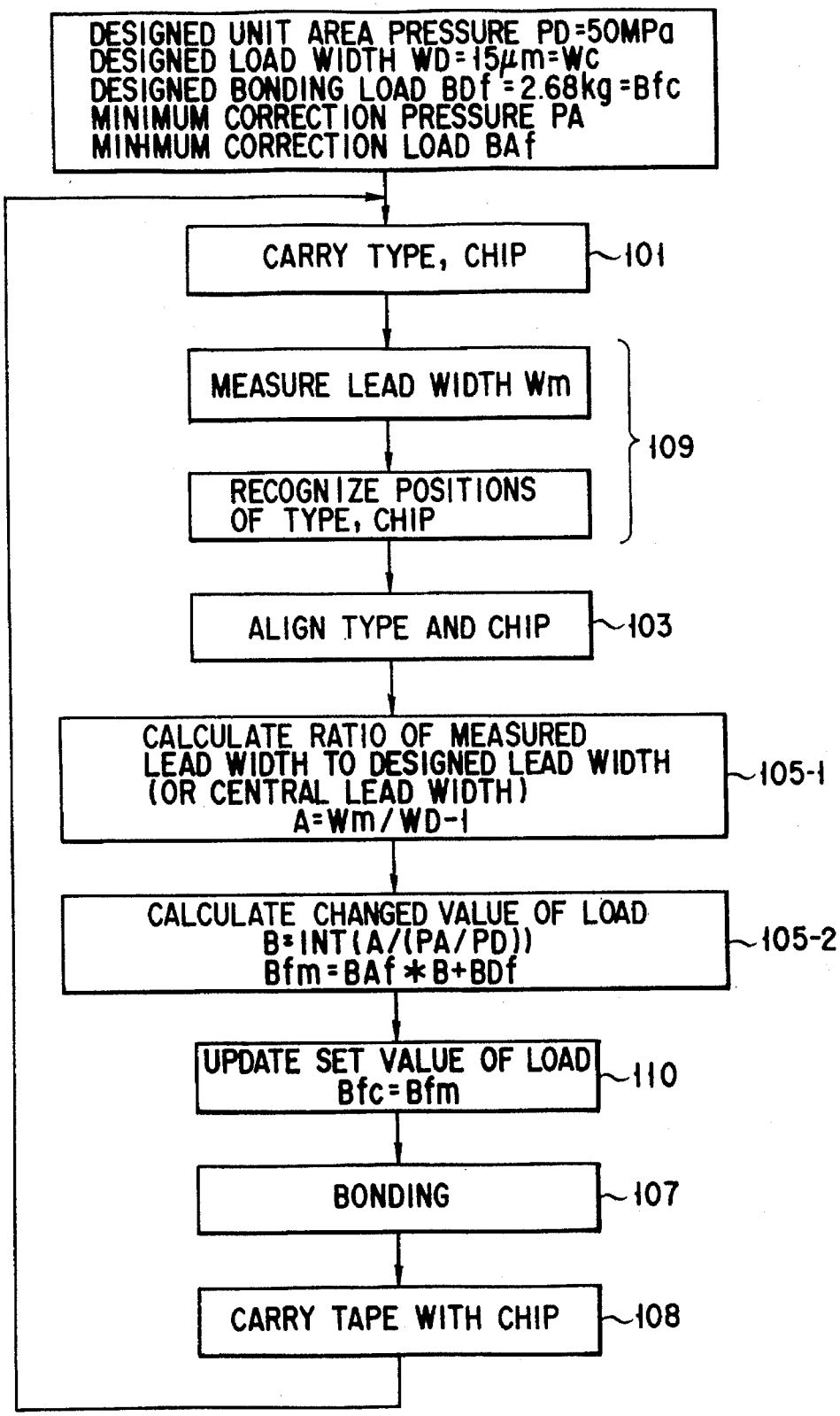
F I G. 9

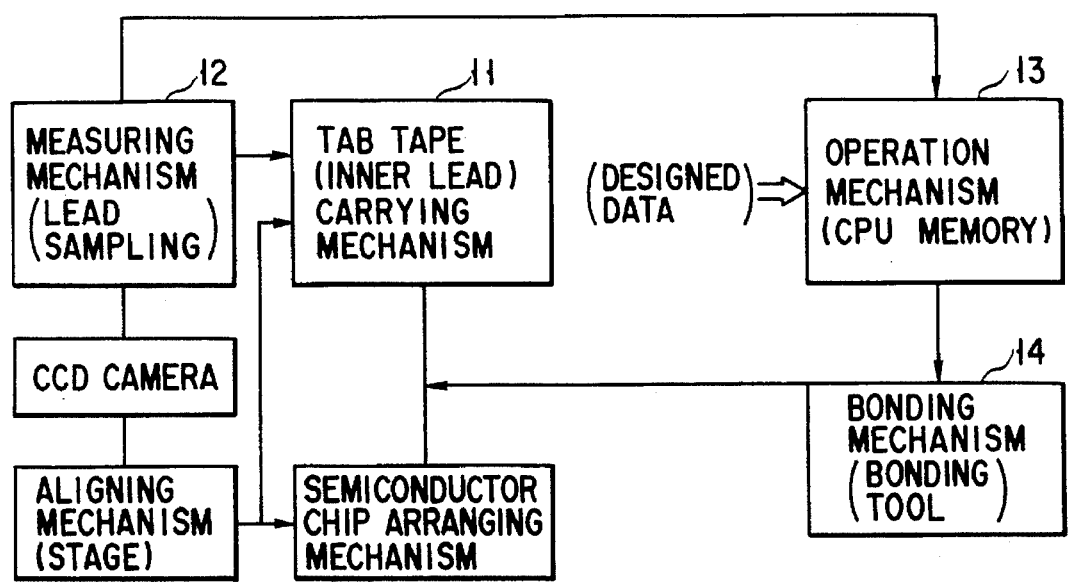
F I G. 10

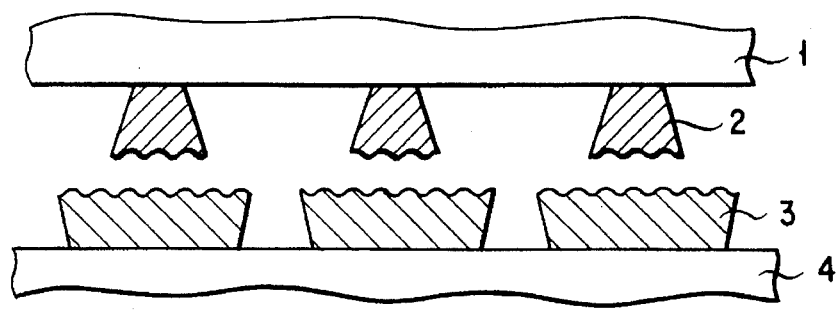
F I G. 11A
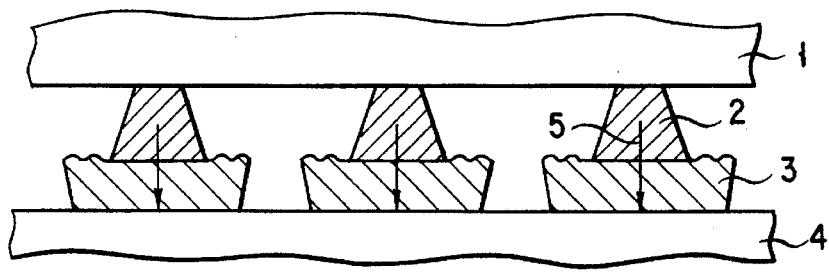
F I G. 11B
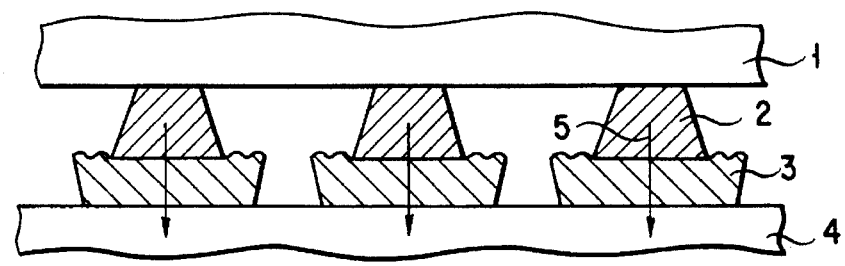
F I G. 12
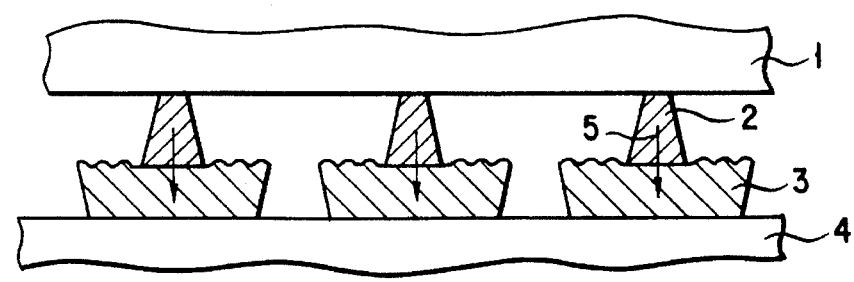
F I G. 13

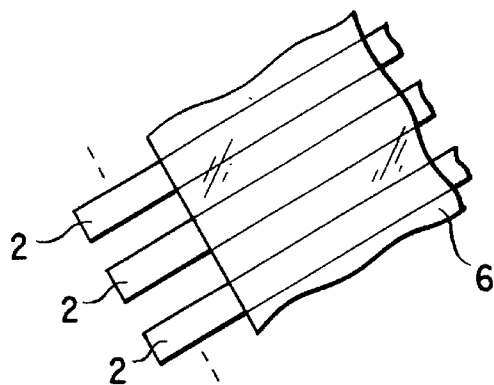
F I G. 14
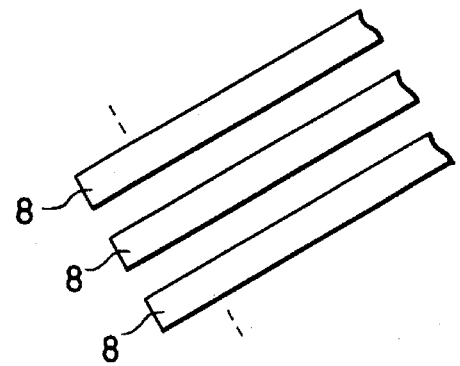
F I G. 15
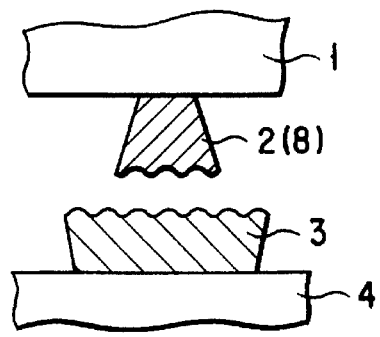
F I G. 16A
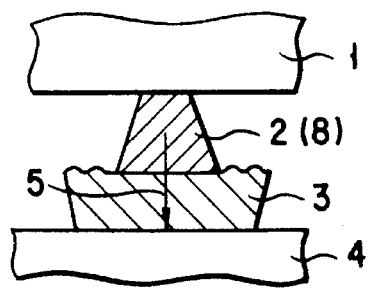
F I G. 16B

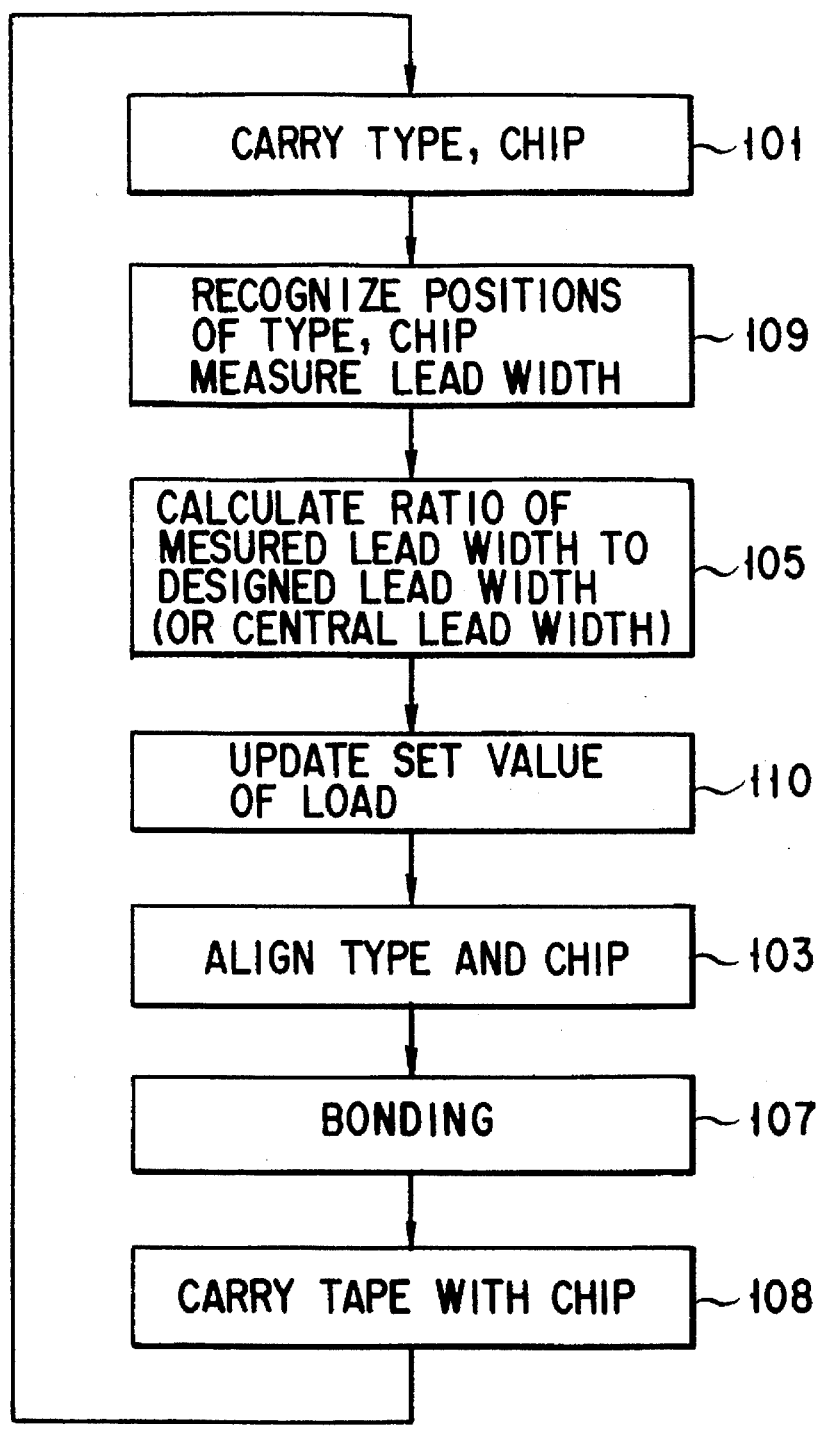
F I G. 18

METHOD AND APPARATUS FOR CONTROLLING BONDING LOAD OF FINE LEAD ELECTRODE

BACKGROUND OF THE INVENTION

1. Field of the Invention

This invention relates to the control for controlling the bonding load of a fine lead electrode, and more particularly to the load correction effected when fine lead electrodes with a pitch of 80 μm or less are bonded to bumps.

2. Description of the Related Art

As the size of the inner lead connected to a semiconductor chip becomes smaller, the lead width thereof becomes smaller. However, the lead is processed by the wet etching process and it is relatively difficult to enhance the lead processing precision. For example, in the case of 80 μm pitch, the actually obtained final dimension of the lead width is 40±5 μm when the designed lead width is 40 μm, and in the case of 60 μm pitch, the finally obtained dimension of the lead width is 25±5 μm when the designed lead width is 25 μm. Therefore, even if the lead pitch is reduced to 20 μm and the lead width is reduced to 15 μm, the lead processing precision is kept at ±5 μm and is not enhanced. As a result, the processing becomes extremely difficult. Particularly, in the case of 50 μm pitch, the designed lead width is 15 μm and the actual dimension of the lead width is 15±5 μm so that the maximum value of the final dimension will be twice the minimum value thereof.

FIG. 1 is a flowchart showing the load control effected at the time of bonding according to an assembling method of the conventional semiconductor device. In this example, the bonding is effected by use of the TAB (tape automated bonding) technique. The positions of a carried TAB tape and semiconductor chip are recognized and aligned with each other, and the leads on the TAB tape and the bump electrodes on the chip are simultaneously bonded together. After the bonding is completed and they are carried, a next carried tape and chip are subjected to the same operation as that described above.

Conventionally, the load at the time of bonding is calculated based on the pressure for unit area necessary for the surfaces of the bump and lead to be connected together. The lead width used for the calculation was the designed value, that is, the central value of the final dimension. For example, if the pressure for unit area is 50 MPa and the area in which the bump and the lead with a pitch of 80 μm are connected is 40×70 μm², the load for each lead becomes approx. 14 g.

If the load of 14 g is set, the pressures for unit area for the lead width 35 μm (minimum final width) and 45 μm (maximum final width) at the time of bonding respectively become 56.25 MPa and 44.25 MPa and the precisions thereof with respect to that of the final central lead width vary by ±12.5%.

Thus, in the case of 80 μm pitch, even if the width of the lead whose designed dimension (central value of the final lead dimension) is 40 μm is deflected by ±5 μm, the unit area pressure is deflected only by ±12.5% and a problem that the lead is not bonded to the bump or the lead is pushed into the bump to expand the side portion of the bump to a large extent does not occur. However, in the cases of the lead pitches of 60 μm and 50 μm, the deflection amounts of the unit area pressures for the respective final central lead widths are ±20% and ±33%, the ratios of the maximum values of the lead widths to the minimum values are 1.5 and 2.0, the ratios of the unit area pressures applied to the maximum lead widths to the unit area pressures applied to the minimum lead widths are respectively 1.5 and 2.0, and a problem that the lead is not bonded to the bump or the lead is pushed into the bump to expand the side portion of the bump to a large extent and cause the adjacent bumps to be short-circuited may occur.

The above problem is explained below with reference to FIGS. 2A, 2B, 3A and 3B. FIGS. 2A to 3B are cross sectional views showing the states in which leads 2 are bonded on respective bumps 3 on a semiconductor chip 4 by use of a bonding tool 1. For example, in a case where the leads are arranged with a pitch of 50 μm and when the pressure for unit area is 50 MPa and the area in which the lead with the final central lead width is connected is 15×70 μm² the load for each lead becomes approx. 5 g. When the load of 5 g is set, the pressures for unit area for the final lead widths 20 μm and 10 μm at the time of bonding respectively become 33.5 MPa and 66.25 MPa. In FIGS. 2A and 2B, the states set at the time of bonding of the lead with the lead width of 20 μm are shown and in FIGS. 3A and 3B, the states set at the time of bonding of the lead with the lead width of 10 μm are shown. The length of an arrow 5 indicates the magnitude of the load applied to the lead of unit area and the same load is applied to the lead in FIGS. 2B and 3B. In the above condition, the pressure of 33.5 MPa for unit area is applied to the lead of width 20 μm to effect the bonding and the pressure of 66.25 MPa for unit area is applied to the lead of width 10 μm to effect the bonding.

In FIG. 2B, the state in which irregular surface portions of the surfaces of the bump and lead cannot be made flat and sufficient bonding cannot be attained since the pressure for unit area is insufficient is shown. In FIG. 3B, the state in which the adjacent bumps may be short-circuited since the pressure for unit area is excessively large and the lead is forcedly pushed into the bump to expand the side portion of the bump is shown.

Thus, the width of the processed lead varies within a permissible range, but the conventional method in which the load for unit lead used at the time of bonding is set based on the central dimension (standard dimension) which is the designed value prior to the processing cannot cope with the present situation in which the lead pitch is increasingly reduced and causes a problem that the yield is significantly lowered.

SUMMARY OF THE INVENTION

Accordingly, an object of this invention is to provide a method and apparatus for assembling a semiconductor device whose load is controlled such that adequate pressure for unit area can be applied to the bonding surface according to a variation in the width of a processed lead.

The above object can be attained by a method of bonding a connecting lead on a bump electrode provided on a semiconductor chip surface by aligning the connecting lead with the bump electrode and applying pressure from above the connecting lead by use of a tool, comprising:

a preliminary setting step of previously setting the standard lead width of the connecting lead and standard tool load which is suitable for the standard lead width and applied by the tool;

a comparing step of acquiring a measured lead width by measuring a width corresponding to the width of a connecting lead to be bonded and actually carried and comparing the measured lead width with the standard lead width; and a bonding step of determining tool load suitable for the actual lead width according to the result of comparison in the comparing step and bonding the connecting lead on the bump electrode by the tool load.

Further, as a manufacturing apparatus for effecting the above method, a manufacturing apparatus for bonding a connecting lead on a bump electrode provided on a semiconductor chip surface by aligning the connecting lead with the bump electrode and applying pressure from above the connecting lead by use of a tool, comprising:

preliminary setting means for previously setting the standard lead width of the connecting lead and standard tool load which is suitable for the standard lead width and applied by the tool;

measuring means for acquiring a measured lead width by measuring a width corresponding to a connecting lead to be actually bonded;

an operating mechanism for comparing the measured lead width with the standard lead width and determining an actual tool load based on the standard tool load according to a difference between the measured lead width and the standard lead width; and bonding means for bonding the connecting lead on the bump electrode by the tool load suitable for the actual lead width.

In this invention, the width of the leads with fine pitch is measured and when the final dimension is deviated from the designed value, optimum tool load for the actual lead width is calculated according to the designed standard lead width (which is also called designed lead width or central lead width) and standard tool load (which is also called designed bonding load) corresponding to the designed standard lead width and the tool load (bonding load) is changed to meet the actual bonding condition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a flowchart showing the load control effected at the time of bonding according to a method of assembling a semiconductor device according to a second embodiment of this invention;

FIG. 9 is a flowchart more specifically showing the load control effected at the time of bonding in FIG. 8;

FIG. 10 is a system block diagram showing a bonding apparatus according to this invention;

FIGS. 11A and 11B are cross sectional views showing the states in which the bonding process according to this invention is effected for the lead with the designed width;

FIG. 12 is a cross sectional view showing the state in which the bonding process according to this invention is effected for the lead with width larger than the designed width;

FIG. 13 is a cross sectional view showing the state in which the bonding process according to this invention is effected for the lead with width smaller than the designed width;

FIG. 14 is an external view showing a TAB tape corresponding to FIG. 11A;

FIG. 15 is an external view showing a lead electrode to which this invention is applied;

FIGS. 16A and 16B are cross sectional views showing other bonding forms to which this invention is applied;

FIG. 18 is a flowchart showing the load control effected at the time of bonding according to a method of assembling a semiconductor device according to a sixth embodiment of this invention.

DETAILED DESCRIPTION OF THE PREFERRED EMBODIMENTS

Figure 1:
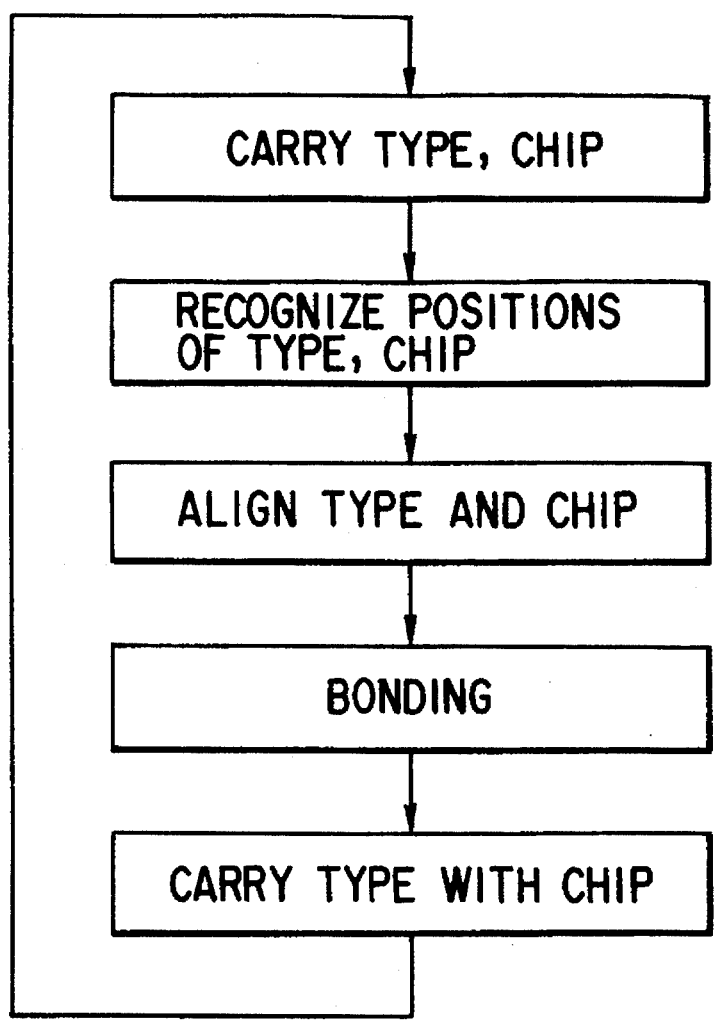
FIG. 1 is a flowchart showing the load control effected at the time of bonding according to a method of assembling a conventional semiconductor device.
Figure 2A:
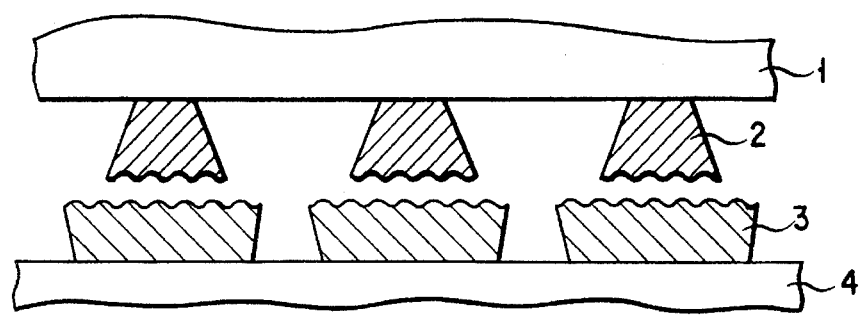
FIGS. 2A and 2B are cross sectional views showing the states in which leads with widths larger than the designed values are bonded by use of the conventional technique.
Figure 2B:
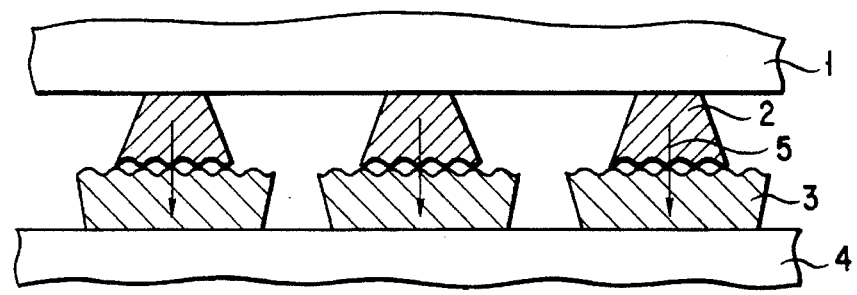
Figure 3A:
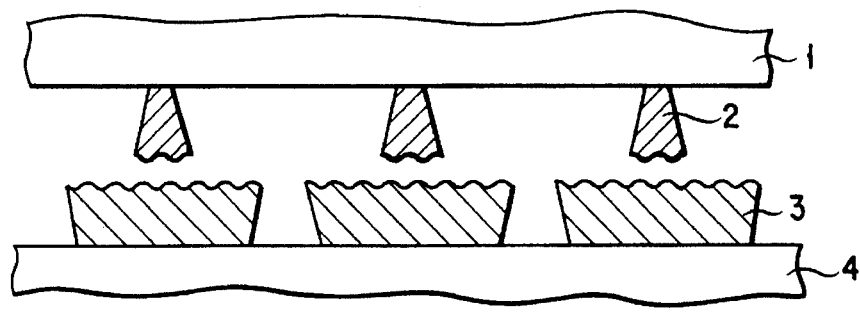
FIGS. 3A and 3B are cross sectional views showing the states in which leads with widths smaller than the designed values are bonded by use of the conventional technique.
Figure 3B:
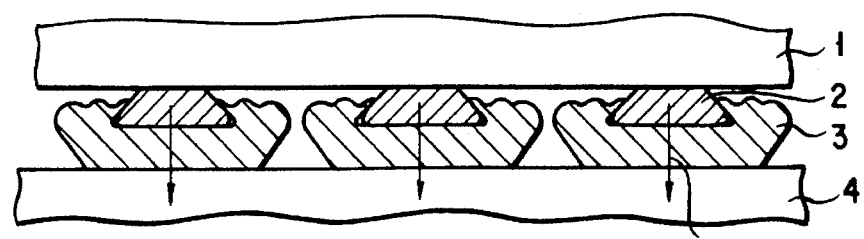
Figure 4:
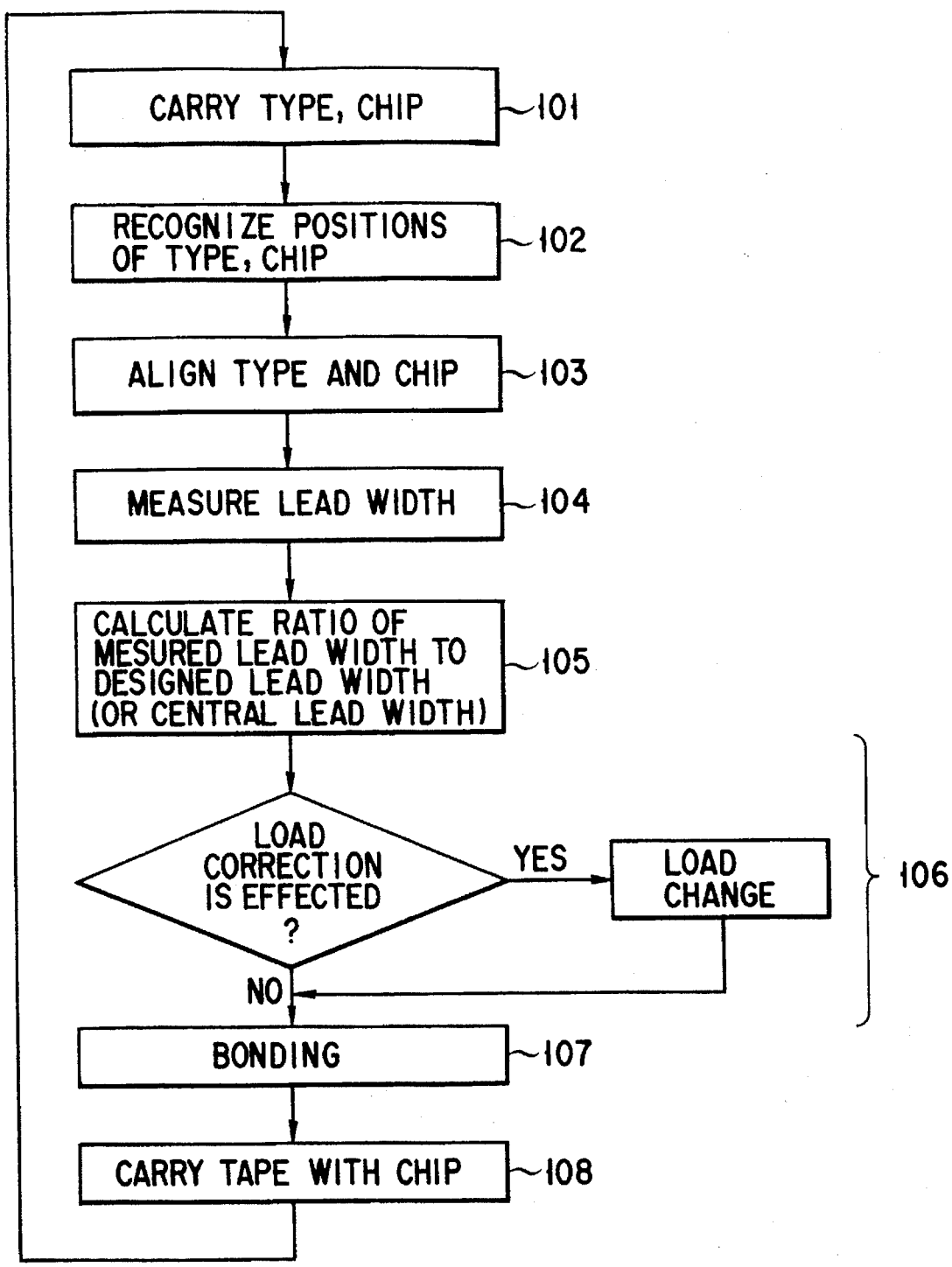
FIG. 4 is a flowchart showing the load control effected at the time of bonding according to a method of assembling a semiconductor device according to a first embodiment of this invention.

FIG. 4 is a flowchart showing the load control operation effected at the time of bonding according to a method of assembling a semiconductor device according to a first embodiment of this invention. A designed value of the lead width (which is hereinafter referred to as a designed lead width) is input and bonding load (which is hereinafter referred to as designed bonding load) suitable for the designed lead width is input prior to the step of continuously bonding a TAB tape on a semiconductor chip.

After the above necessary values are input, the continuous bonding step is started. First, the TAB tape and chip are carried to preset positions (101). Then, the positions of the tape and chip are recognized by processing an image derived by a CCD camera (102). Next, alignment of the tape and chip is completed (103), the image of an inner lead of the TAB tape is derived by use of the CCD camera used for recognition of the positions and the value of the lead width (which is hereinafter referred to as a measured lead width) actually measured by processing the image data is derived (104). After this, the measured lead width is compared with the designed lead width and the ratio of the measured lead width to the designed lead width is calculated (105), and if a difference from the designed bonding load becomes larger than a preset reference value, the bonding load is changed from the designed bonding load to bonding load suitable for the measured lead width based on the calculated ratio (106). In the step 106, the load correction is not effected when a difference from the designed bonding load does not exceed the preset reference value. After this, the inner leads on the TAB tape are bonded on the bump electrodes on the semiconductor chip by the adequate bonding load (107). After the bonding, the tape with the chip is carried (108) and the TAB tape and chip for the next cycle are carried to the preset positions (101).

Figure 5:
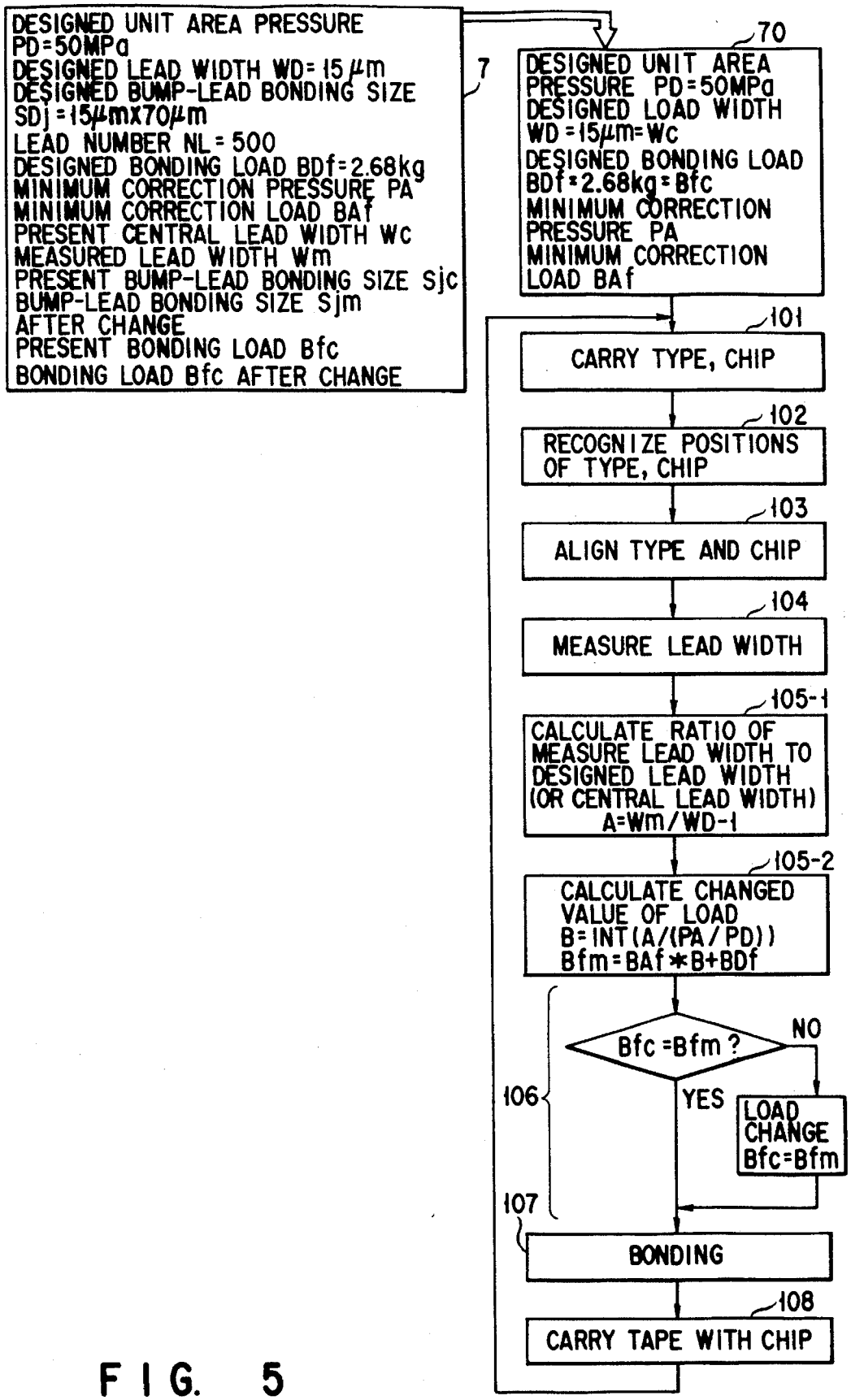
FIG. 5 is a flowchart more specifically showing the load control effected at the time of bonding in FIG. 4.

FIG. 5 is a flowchart more specifically showing the load control operation effected at the time of bonding in FIG. 4. The load setting changing operation and the measurement of the actual lead width after the processing of the TAB tape are more concretely shown. In FIG. 5, "present central lead width Wc" in an input data block 7 is data of the lead width obtained in the bonding process in the preceding cycle for the lead to be bonded in the present cycle and the initial value thereof is set equal to the designed lead width. Wc is a preliminary value used when the bonding state is deviated from the designed value for some reason and it is not used in the explanation of this flow. Further, "present bump-lead bonding size Sjc" and "bump-lead bonding size Sjm after change" are reference data for checking the bonding state and neither of them is used in the explanation of this flow.

First, the designed unit area pressure PD, designed lead width WD, designed bump-lead bonding size SDj, and lead number NL are respectively set to 50 MPa, 15 μm, 15×70 μm, and 500 prior to the continuous bonding process. The designed bonding load BDj is calculated based on the above values and approx. 2.68 kg is obtained as the value thereof. Without giving the designed unit area pressure, designed lead width, designed bump-lead bonding size, and lead number and calculating the designed bonding load, only the values of the designed lead width and the previously calculated designed bonding load may be set. Further, the minimum correction pressure PA is set based on the percentage of the designed unit area pressure, and in this embodiment, it is set to 5 MPa which is 10% of the above designed unit area pressure. The minimum correction load BAf is calculated based on the above value, and it this embodiment, it is set to 0.268 kg (7, 70 in FIG. 5).

Carriage of the tape and chip to be bonded in the first cycle is completed (101), recognition of the positions of the tape and chip and alignment thereof are completed by use of the CCD camera (102, 103), and then, the width of the inner lead is measured by use of the CCD camera. At this time, light for illumination may be applied from above or below the lead. The number of leads to be measured may preferably be determined by taking a variation amount of the lead widths of all of the leads into consideration, but it is necessary to set an adequate number because the measurement time becomes long and the throughput of the bonding process is lowered if an excessively large number of leads are measured.

An average value Wm for a plurality of leads measured in the TAB tape for the bonding process in the first cycle is calculated. This is the measured lead width (104). In this example, it is supposed that the measured lead width in the first cycle is 21 μm.

The ratio A of a difference of the measured lead width Wm=21 μm to the designed lead width WD=15 μm can be calculated as (Wm/WD−1) and it becomes 0.4. As a result, it is understood that the actual lead width is made larger than the designed lead width by 40% (105-1). Next, the ratio of the ratio A of a difference of the measured lead width to the designed lead width to the ratio (PA/PD) of the minimum correction pressure to the designed unit area pressure PD is calculated, and at this time, fractions thereof are discarded and the ratio B is derived as an integral number and expressed by B. The operation of deriving the ratio as an integral number is expressed by INT( ) in FIG. 5 which indicates that the numeral in the parentheses is converted into an integral number. In this example, the value of the ratio B is 4. Then, the product of the ratio B and the minimum correction load BAf is added to the designed bonding load to derive bonding load Bfm after the change. In this embodiment, Bfm is set to 2.752 kg (105-2).

Next, the present bonding load Bfc and the bonding load Bfm after the change are compared. The present bonding load Bfc is set to the designed bonding load as the initial value thereof. If the result of comparison indicates the coincidence, the bonding process is effected without changing the bonding load of the apparatus, and if the result of comparison indicates the non-coincidence, the value of Bfc is changed to the value of Bfm after the change, the bonding load of the apparatus is reset (to Bfc) and then the bonding process is effected. According to this embodiment, since the bonding load Bfc is set to 2.68 kg and the bonding load Bfm after the change is 3.752 kg, the value of the bonding load Bfc is replaced by the bonding load Bfm 3.752 kg after the change (106). Thus, the actual bonding process is effected by use of the bonding load 3.752 kg of the apparatus (107).

Next, the tape and chip to be bonded in the second cycle are carried at the same time that the tape with the chip which has been subjected to the bonding process is carried (108, 101). The positions of the tape and chip are recognized and aligned by use of the CCD camera (102, 103), and then the inner lead width is measured. The measurement is effected in the same manner as in the first cycle, and in this embodiment, it is supposed that the measured inner lead width is 22 μm (104).

The same process as the bonding process in the first cycle is effected, the bonding load Bfm after the change is calculated and the bonding load of 3.752 kg can be derived (105-1, 105-2). Since the thus derived value is the same as the present bonding load Bfc, the actual bonding process is effected without changing the bonding load of the apparatus (106, 107).

Thus, when the bonding load after the change is the same as the present bonding load, the control operation is effected to permit the bonding process to be effected without effecting the bonding load setting operation with respect to the apparatus. An air cylinder is used in the load generating section used in the bonding apparatus in many cases, and it takes time to transmit a load setting signal, set the load and feeding back a load setting completion signal. When the same bonding load setting signal as that in the preceding cycle is transmitted, time for load setting becomes shorter, but time for load change is necessary and the bonding time becomes long. For this reason, the bonding load setting operation is omitted when it is not necessary to effect the bonding load setting operation. This contributes to the enhancement of the processing speed.

Figure 7:
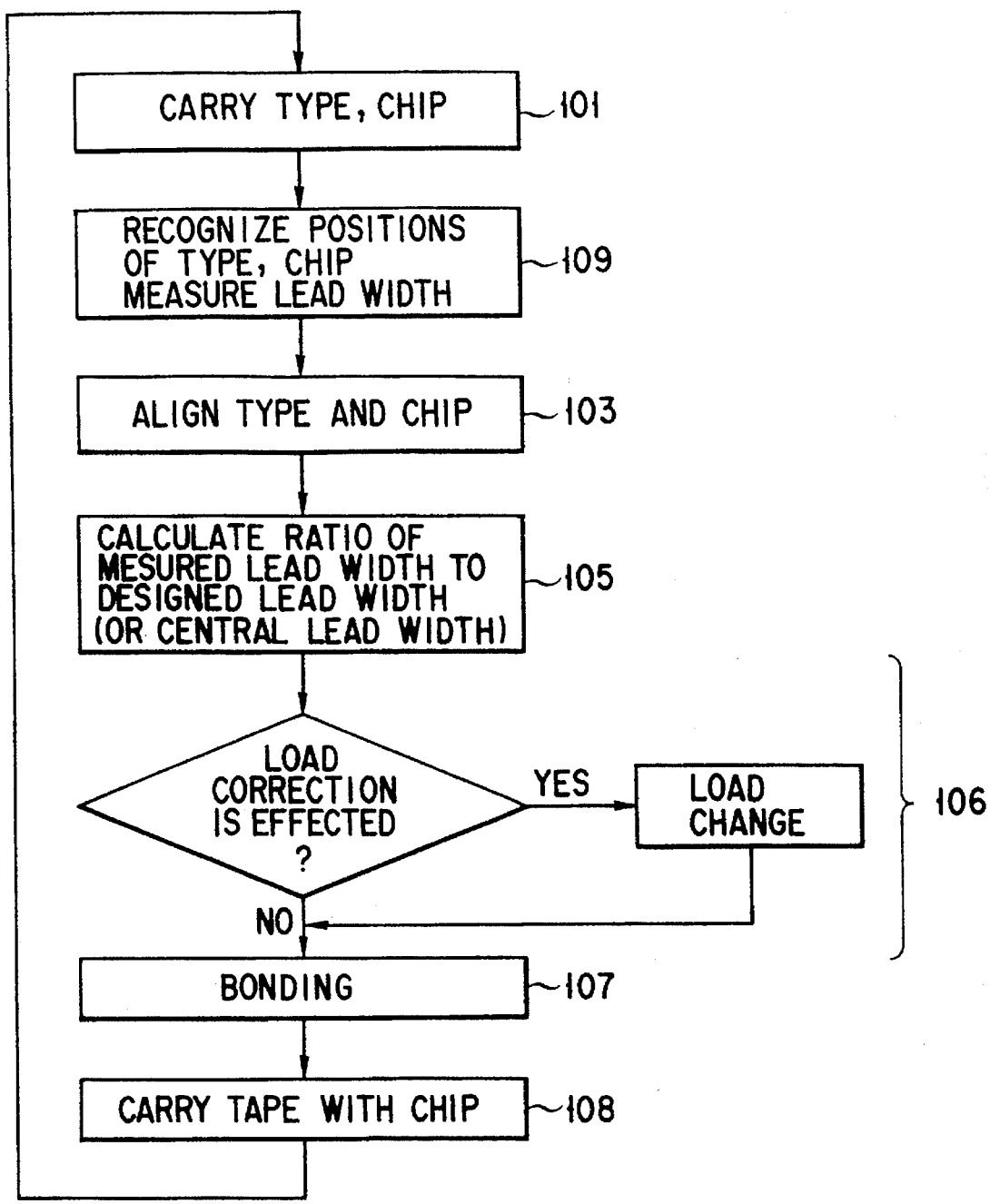
FIG. 7 is a flowchart showing the load control effected at the time of bonding according to a method of assembling a semiconductor device according to a third embodiment of this invention.

FIGS. 6 and 7 are flowcharts showing the load control operations effected at the time of bonding according to methods of assembling a semiconductor device according to second and third embodiments of this invention. The embodiment in FIG. 6 is different from the first embodiment of FIG. 4 in that the measurement of the lead width (104) is effected prior to the recognition of the positions of the tape and chip (102, 103). The embodiment in FIG. 7 is different from the first embodiment of FIG. 4 in that the measurement of the lead dimension is effected at the time of recognition of the positions of the tape and chip (109).

Figure 8:
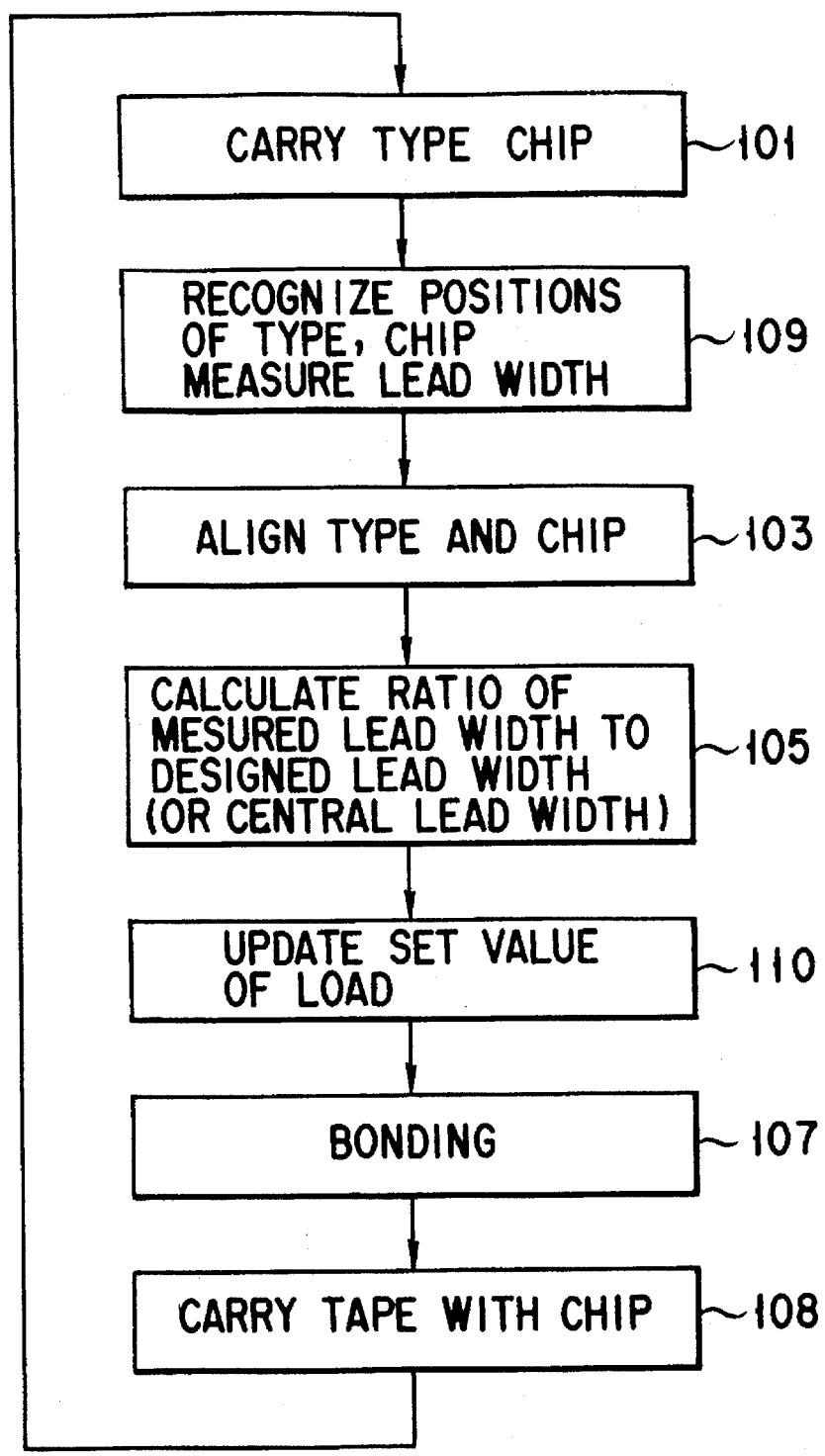
FIG. 8 is a flowchart showing the load control effected at the time of bonding according to a method of assembling a semiconductor device according to a fourth embodiment of this invention.

FIG. 8 is a flowchart showing the load control operation effected at the time of bonding according to a method of assembling a semiconductor device according to a fourth embodiment of this invention. The embodiment in FIG. 8 is different from the embodiment of FIG. 7 in that the apparatus is caused to sequentially effect the bonding load setting operation according to the calculated bonding load (110). When the present bonding load in the preceding cycle is the same as the bonding load after the change, the bonding load setting operation of the apparatus is omitted to suppress an increase in the bonding time in the first to third embodiments, but in the fourth embodiment, it is preferable to use a load generating structure which does not take a long time for the bonding load setting operation. For example, instead of the load generating mechanism using an air cylinder and taking a long time for the load setting, a load generating structure using a torque motor is used and the fourth embodiment is applied. With the load generating structure using the torque motor, the setting time can be significantly reduced and the time required for the load change of the apparatus can be reduced to such a small value which can be neglected in comparison with the whole bonding processing time.

FIG. 9 is a flowchart more specifically showing the load control effected at the time of bonding in FIG. 8. The load setting changing operation and the actual lead width measurement after the processing of the TAB tape are more concretely shown. Settings of various values, carriage of the tape and chip to be bonded in the first cycle and measurement of the lead width prior to the continuous bonding process are basically the same as in a case of the first embodiment explained with reference to FIG. 5. In FIG. 9, a step corresponding to the step 109 in FIG. 8 is shown by 109.

In FIG. 9, it is supposed that the measured lead width in the first cycle is 21 μm. The ratio A of a difference of the measured lead width Wm=21 μm to the designed lead width WD=15 μm can be calculated as (Wm/WD−1) and it becomes 0.4. As a result, it is understood that the actual lead width is made larger than the designed lead width by 40% (105-1).

Next, the ratio of the ratio A of a difference of the measured lead width to the designed lead width to the ratio (PA/PD) of the minimum correction pressure to the designed unit area pressure PD is calculated, and at this time, fractions thereof are discarded and the ratio is derived as an integral number and expressed by B. The operation of deriving the ratio as an integral number is expressed by INT( ) in FIG. 5 which indicates that the numeral in the parentheses is converted into an integral number. In this example, the value of the ratio B is 4. Then, the product of the ratio B and the minimum correction load BAf is added to the designed bonding load to derive a bonding load Bfm after the change. In this embodiment, Bfm is set to 2.752 kg (105-2).

Next, the present bonding load Bfc is replaced by the bonding load Bfm after the change (110). The present bonding load Bfc is set to the designed bonding load as the initial value thereof. If the values of the bonding loads Bfc and Bfm are the same, the bonding load of the apparatus is changed from the present bonding load Bfc to the bonding load Bfm after the change on software, but the bonding process is effected without changing the actual bonding load. Further, if the present bonding load Bfc and the bonding load Bfm after the change are different, the value of Bfc is replaced by the value of Bfm after the change, the bonding load of the apparatus is reset (updating of Bfc) and then the bonding process is effected (107). According to this embodiment, since the present bonding load Bfc is 2.68 kg and the bonding load Bfm after the change is 3.752 kg, the value of the present bonding load Bfc is replaced by the bonding load 3.752 kg after the change (the present bonding load Bfc is updated to 3.752 kg), and the actual bonding process is effected by use of the bonding load 3.752 kg of the apparatus.

Next, the tape and chip to be bonded in the second cycle are carried at the same time that the tape with the chip which has been subjected to the bonding process is carried (108, 101). The width of the inner lead is measured and the positions of the tape and chip are recognized and aligned by use of the CCD camera (109). The measurement is effected in the same manner as in the first cycle, and in this embodiment, it is supposed that the measured lead width is 22 μm.

The same process as the bonding process in the first cycle is effected, the bonding load Bfm after the change is calculated and the bonding load of 3.752 kg can be derived. After this, the present bonding load Bfc=3.752 is updated to the bonding load Bfm=3.752 after the change and set as the bonding load of the apparatus. That is, in the embodiment of FIG. 9, even if the present bonding load Bfc and the bonding load Bfm after the change have the same value, the present bonding load Bfc is always updated to the bonding load Bfm after the change in each bonding cycle and the bonding process is effected after completion of the setting of the bonding load (107).

FIG. 10 is a system block diagram showing a bonding apparatus according to this invention. The lead widths of a preset number of leads carried by a TAB tape carrying mechanism 11 are measured by use of a measuring mechanism 12 to derive an average measured lead width, the average measured lead width is compared with designed data previously stored in an operating mechanism 13, and a bonding mechanism 14 is driven by a bonding load suitable for the width of a lead which is to be bonded in the present cycle.

FIGS. 11A, 11B, 12, and 13 are cross sectional views showing the bonding states of the leads bonded by use of the system of FIG. 10. FIGS. 11A, 11B, 12 and 13 show the states in which leads 2 are bonded on respective bumps 3 on a semiconductor chip 4 by means of a bonding tool 1. FIGS. 11A and 11B show the bonding state in a case where the lead width is set as designed, FIG. 12 shows the bonding state in a case where the lead width is set larger than the designed value, and FIG. 13 shows the bonding state in a case where the lead width is set smaller than the designed value. The length of an arrow 5 indicates the degree of the load applied to the lead of unit area and the optimum load for the lead width is applied to the lead.

FIG. 14 is an external view showing a TAB tape corresponding to FIG. 11A. In the above embodiments, as shown in FIG. 14, the bonding of the TAB tape is shown as an example. That is, the array of leads 2 is supported by an insulative film 6 which cannot be observed in the bonding portion. However, it is not limited to such a TAB tape, but can be applied to the bonding of lead electrodes 8 formed by punching or the like as shown in FIG. 15 in some cases. If the lead electrodes 8 become fine and there occurs a possibility that the lead array will be disturbed at the time of bonding, an insulative tape (not shown) is attached to support the lead array. Further, in the explanation of the above embodiments, the TAB tape is simultaneously bonded by the tool 1, but as shown in FIGS. 16A and 16B, this invention can be applied to such a device which individually bonds the leads. Further, this applies to the lead electrodes 8 in FIG. 15.

In the explanation of the above embodiments, the leads whose dimensions are measured are the leads to be bonded, but it is possible to measure the dimensions of the leads following the leads which are to be bonded. That is, if the dimensions of leads to be next carried to the bonding stage are previously measured by use of time in which the already carried leads are bonded, the delay of the measurement time overlaps the bonding time, thus making it possible to reduce time necessary for the whole process.

Figure 17:
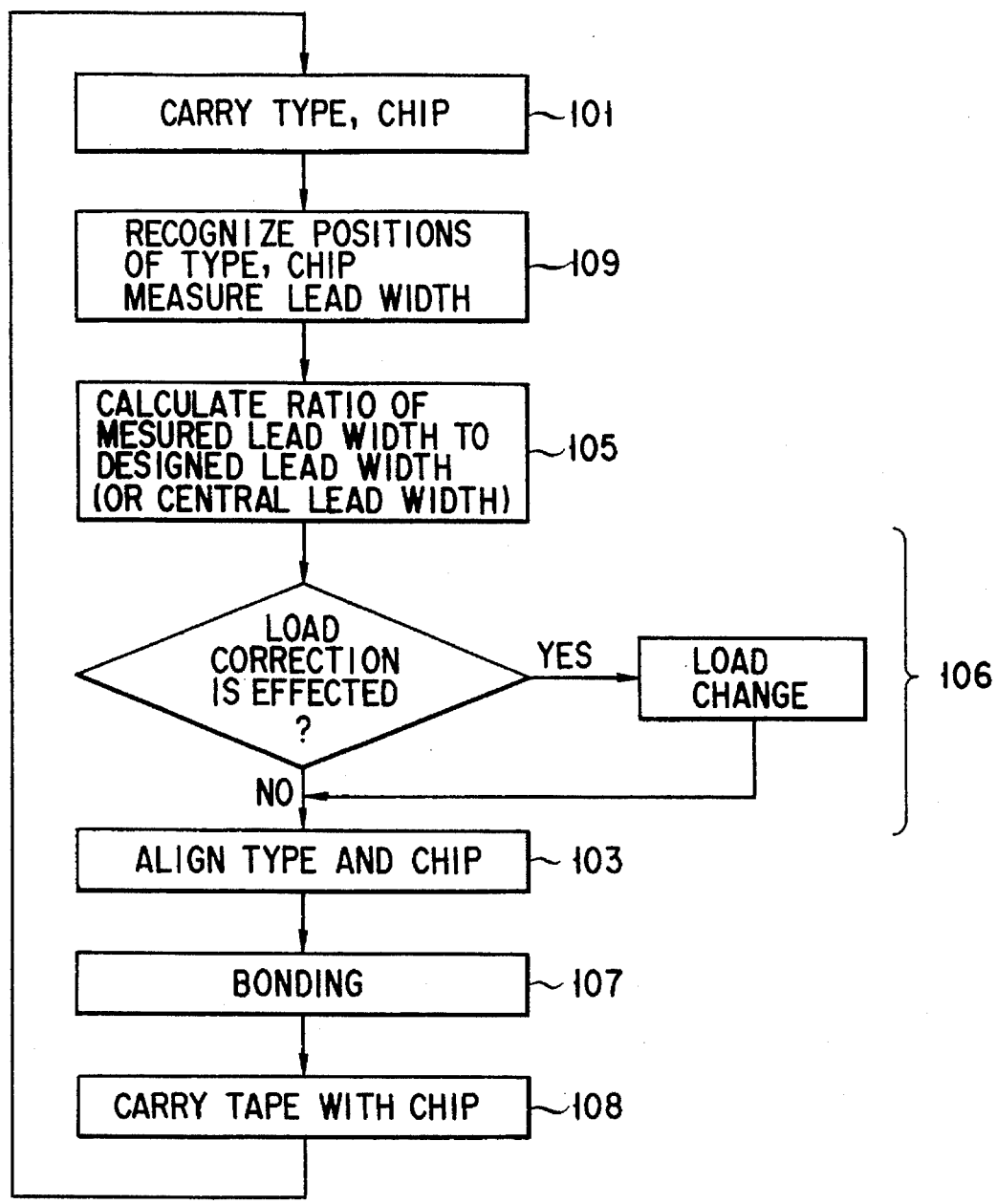
FIG. 17 is a flowchart showing the load control effected at the time of bonding according to a method of assembling a semiconductor device according to a fifth embodiment of this invention.

FIG. 17 is a flowchart showing the load control effected at the time of bonding according to a method of assembling a semiconductor device according to a fifth embodiment of this invention. FIG. 17 corresponds to FIG. 7 and the embodiment of FIG. 17 is different from the embodiment of FIG. 7 in that the alignment step 103 for the tape and chip is effected before the bonding process 107. The flowchart of FIG. 17 permits the pipeline process. That is, the steps 109, 105, 106 are effected for the TAB tape in a stage just prior to the stage in which the tape is actually bonded. That is, the steps 109, 105, 106 are effected for the TAB tape which is not yet bonded and is to be next bonded at the same time as the steps 103, 107, and when the stage in which the bonding process is actually effected is started, calculation for the bonding load is completed. As a result, the high-speed bonding process can be easily attained. In addition, it can be considered to separate the steps 109, 105, 106 and effect the step 109 in a cycle of a stage just prior to the steps 105, 106 by taking it into consideration that the process can be divided into a plurality of pipeline stages. Thus, the three processes respectively including the step 109, the steps 105, 106 and the steps 103, 107 in the actual bonding stage are effected at the same time for the three pairs of TAB tapes and chips adjacent to each other, thereby making it possible to effect the high-speed and highly reliable bonding process as described above.

FIG. 18 is a flowchart showing the load control effected at the time of bonding according to a method of assembling a semiconductor device according to a sixth embodiment of this invention. FIG. 18 corresponds to FIG. 8 and the embodiment of FIG. 18 is different from the embodiment of FIG. 8 in that the alignment step 103 for the tape and chip is effected before the bonding process 107. Like the case of FIG. 17, the flowchart of FIG. 18 permits the pipeline process. That is, the steps 109, 105, 110 are effected for the TAB tape in a stage just prior to the stage in which the tape is actually bonded. That is, the steps 109, 105, 110 are effected for the TAB tape which is not yet bonded and is to be next bonded at the same time as the steps 103, 107, and when the stage in which the bonding process is actually effected is started, calculation for the bonding load is completed. In addition, it can be considered to separate the steps 109, 105, 110 and effect the step 109 in a cycle of a stage just prior to the steps 105, 110 by taking it into consideration that the process can be divided into a plurality of pipeline stages. Thus, the three processes respectively including the step 109, the steps 105, 110 and the steps 103, 107 in the actual bonding stage are effected at the same time for the three pairs of TAB tapes and chips adjacent to each other, thereby making it possible to effect the high-speed and highly reliable bonding process like the case of FIG. 17.

In the above embodiments, image data acquired by use of the CCD camera is used for measurement of the lead width, but dimension measurement using a laser beam can be used. Further, it is considered that the measured lead width can be acquired by measuring a width corresponding to the inner lead width provided in the tape instead of directly measuring the actual inner lead width.

With the above construction, since the bonding load suitable for the width of the lead to be bonded can be set, adequate unit area pressure can be applied to the bonding surface even if the width of the processed lead is deviated from the designed value. As a result, even if the lead width varies, the bonding surfaces of the bump and the lead can be set in the constant and adequate bonding state. Therefore, inner leads with a fine pitch can be bonded with high reliability and the yield thereof can be enhanced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of bonding a connecting lead on a bump electrode provided on a semiconductor chip surface by aligning the connecting lead with the bump electrode and applying pressure from above the connecting lead by use of a tool, comprising:

a preliminary setting step of previously setting the standard lead width of the connecting lead and a standard tool load which is optimum for the standard lead width and applied by the tool;

a comparing step of acquiring a measured lead width by measuring a width corresponding to the width of a connecting lead to be bonded and actually carried and comparing the measured lead width with the standard lead width; and a bonding step of determining tool load suitable for the actual lead width according to the result of comparison in said comparing step and bonding the connecting lead on the bump electrode by the tool load.

2. A bonding method according to claim 1, wherein said bonding step is effected without changing the tool load used in the bonding step in a stage just prior to the present stage when the result of comparison in said comparing step is within a predetermined permissible range, and the tool load used in the bonding step in a stage or cycle just prior to the present stage or cycle is updated and said bonding step is effected by use of the updated tool load when the result of comparison in said comparing step exceeds the predetermined permissible range.

3. A bonding method according to claim 1, wherein the tool load used in the bonding step in a stage or cycle just prior to the present stage or cycle is always updated according to the result of comparison in said comparing step and said bonding step is effected by use of the updated tool load.

4. A bonding method according to claim 2 or 3, wherein the processing time required for said bonding step overlaps the processing time required for said comparing step.

5. A bonding method according to claim 1, wherein determination of the tool load according to the result of comparison in said comparing step is made by effecting an arithmetic operation for changing the tool load with a predetermined permissible range from the standard tool load according to the ratio of a difference of the measured lead width to the standard lead width.

6. A method of bonding a connecting lead on a bump electrode provided on a semiconductor chip surface by aligning the connecting lead with the bump electrode and applying pressure from above the connecting lead by use of a tool, comprising:

a preliminary setting step of previously setting the standard lead width of the connecting lead and a standard tool load which is optimum for the standard lead width and applied by the tool;

a measuring step of acquiring a measured lead width by measuring a width corresponding to the width of a connecting lead to be actually bonded;

an operating step of comparing the measured lead width with the standard lead width and determining an actual tool load based on the standard tool load according to a difference between the measured lead width and the standard lead width; and a bonding step of bonding the connecting lead on the bump electrode by the tool load suitable for the actual lead width.

7. A bonding method according to claim 6, wherein said operating step includes a determining step of determining whether the tool load is changed from the standard tool load or not according to the degree of a difference between the measured lead width and the standard lead width.

8. A bonding method according to claim 6, wherein said operating step updates the tool load based on the standard tool load in the calculation of the ratio derived from a difference between the measured lead width and the standard lead width and said bonding step is effected by use of the updated tool load.

9. A bonding method according to claim 6, wherein said measuring step, operating step, bonding step are effected by a pipeline process effected in a overlapped time.

10. A bonding method according to claim 1 or 6, wherein the connecting lead is a lead electrode having a plurality of leads formed on an insulative film and said bonding step simultaneously bonds the lead electrode formed on the film on corresponding bump electrodes.

11. A bonding method according to claim 1 or 6, wherein the connecting lead is a lead electrode having a plurality of leads formed on an insulative film and said bonding step individually bonds the lead electrode formed on the film on corresponding bump electrodes.

12. A bonding method according to claim 1 or 6, wherein the connecting lead includes inner lead electrodes having connection to the exterior of the semiconductor chip and said bonding step simultaneously bonds the inner lead electrodes on corresponding bump electrodes.

13. A bonding method according to claim 1 or 6, wherein the connecting lead includes inner lead electrodes having connection to the exterior of the semiconductor chip and said bonding step individually bonds the inner lead electrodes on corresponding bump electrodes.

14. A manufacturing apparatus for bonding a connecting lead on a bump electrode provided on a semiconductor chip surface by aligning the connecting lead with the bump electrode and applying pressure from above the connecting lead by use of a tool, comprising:

preliminary setting means for previously setting the standard lead width of the connecting lead and a standard tool load which is optimum for the standard lead width and applied by the tool;

measuring means for acquiring a measured lead width by measuring a width corresponding to the width of a connecting lead to be actually bonded;

an operating mechanism for comparing the measured lead width with the standard lead width and determining an actual tool load based on the standard tool load according to a difference between the measured lead width and the standard lead width; and bonding means for bonding the connecting lead on the bump electrode by the tool load suitable for the actual lead width.

15. A manufacturing apparatus according to claim 14, wherein said measuring means, operating means, bonding means are realized by a pipeline processing mechanism effected in overlapped time.

16. A manufacturing apparatus according to claim 14, wherein the connecting lead is a lead electrode having a plurality of leads formed on an insulative film and said bonding means simultaneously bonds the lead electrode formed on the film on corresponding bump electrodes.

17. A manufacturing apparatus according to claim 14, wherein the connecting lead is a lead electrode having a plurality of leads formed on an insulative film and said bonding means individually bonds the lead electrode formed on the film on corresponding bump electrodes.

18. A manufacturing apparatus according to claim 14, wherein the connecting lead includes inner lead electrodes having connection to the exterior of the semiconductor chip and said bonding means simultaneously bonds the inner lead electrodes on corresponding bump electrodes.

19. A manufacturing apparatus according to claim 14, wherein the connecting lead includes inner lead electrodes having connection to the exterior of the semiconductor chip and said bonding means individually bonds the inner lead electrodes on corresponding bump electrodes.

* * * * *